United States Patent
Kim et al.

(10) Patent No.: US 10,248,911 B2
(45) Date of Patent: Apr. 2, 2019

(54) ION TRAPPING DEVICE WITH INSULATING LAYER EXPOSURE PREVENTION AND METHOD FOR MANUFACTURING SAME

(71) Applicants: SK TELECOM CO., LTD., Seoul (KR); SEOUL NATIONAL UNIVERSITY R&DB FOUNDATION, Seoul (KR)

(72) Inventors: Taehyun Kim, Seoul (KR); Dongil Cho, Seoul (KR); Seokjun Hong, Seoul (KR); Minjae Lee, Seoul (KR); Hongjin Cheon, Seoul (KR)

(73) Assignees: ID QUANTIQUE, Genève (CH); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/520,108

(22) Filed: Apr. 19, 2017

(65) Prior Publication Data

US 2017/0316335 A1    Nov. 2, 2017

Related U.S. Application Data

(63) Continuation of application No. PCT/KR2015/011581, filed on Oct. 30, 2015.

(30) Foreign Application Priority Data

Oct. 31, 2014 (KR) .................. 10-2014-0150078

(51) Int. Cl.
*G06N 99/00*    (2010.01)
*H01L 49/00*    (2006.01)
(Continued)

(52) U.S. Cl.
CPC .............. *G06N 99/002* (2013.01); *H01J 3/00* (2013.01); *H01L 49/006* (2013.01); *H01J 49/0018* (2013.01)

(58) Field of Classification Search
None
See application file for complete search history.

(56) References Cited

U.S. PATENT DOCUMENTS

| 7,012,250 | B1 * | 3/2006 | Aksyuk | ............... | H01J 49/0018 |
| | | | | | 250/281 |
| 7,411,187 | B2 * | 8/2008 | Monroe | ............... | G06N 99/002 |
| | | | | | 250/207 |

(Continued)

FOREIGN PATENT DOCUMENTS

| EP | 2913839 A1 * | 9/2015 | ........... G06N 99/002 |
| KR | 1020000043880 A | 7/2000 | |
| WO | WO 2015128438 A1 * | 9/2015 | ........... G06N 99/002 |

OTHER PUBLICATIONS

Stick et al., "Demonstration of microfabricated surface electrode ion trap", 2012.*

(Continued)

*Primary Examiner* — Michael J Logie
(74) *Attorney, Agent, or Firm* — Hauptman Ham, LLP

(57) ABSTRACT

An ion trap device is provided as well as a method of manufacturing the ion trap device including a substrate, central DC electrode, RF electrode, side electrode and an insulating layer. Disposed over the substrate, the central DC electrode includes DC connector pad and DC rail connected thereto. The RF electrode includes RF rail adjacent to the DC rail and RF pad connected to RF rail. The side electrode has RF electrode disposed between thereof and the central DC electrode. The insulating layer supports one of the central DC electrode, RF electrode and side electrode, on a top surface of the substrate. The insulating layer includes (Continued)

first insulating layer and second insulating layer disposed over the first insulating layer, and the second insulating layer includes an overhang protruding with respect to the first insulating layer in a width direction of the ion trap device.

6 Claims, 17 Drawing Sheets

(51) Int. Cl.
  *H01J 3/00* (2006.01)
  *H01J 49/00* (2006.01)

(56) References Cited

U.S. PATENT DOCUMENTS

| 7,928,375 B1* | 4/2011 | Mangan | H01J 49/0018 250/283 |
|---|---|---|---|
| 2005/0061767 A1 | 3/2005 | Pai et al. | |
| 2006/0169882 A1 | 8/2006 | Pau et al. | |
| 2007/0040113 A1* | 2/2007 | Monroe | G06N 99/002 250/290 |
| 2009/0321719 A1* | 12/2009 | Folman | B82Y 10/00 257/25 |
| 2010/0084549 A1 | 4/2010 | Ermakov et al. | |
| 2016/0027604 A1* | 1/2016 | Cho | H01J 49/0013 250/489 |
| 2017/0221693 A1* | 8/2017 | Kim | H01J 49/10 |

OTHER PUBLICATIONS

Hughes et al., "Microfabricated ion traps", Contemporary Physics, 2011.*
Mount et al. "Single qubit manipulation in a microfabricated surface electrode ion trap", 2013.*
International Search Report for PCT/KR2015/011581 dated Feb. 12, 2016.

* cited by examiner

*-Prior Art-*

*-Prior Art-*

*-Prior Art-*

-Prior Art-

*-Prior Art-*

ION TRAPPING DEVICE WITH INSULATING LAYER EXPOSURE PREVENTION AND METHOD FOR MANUFACTURING SAME

CROSS-REFERENCE TO RELATED APPLICATION

This application is a continuation of International Application No. PCT/KR2015/011581, filed Oct. 30, 2015, which claims priority to Korean Patent Application No. 10-2014-0150078, filed on Oct. 31, 2014. The entire disclosures of each of the above applications are incorporated herein by reference.

TECHNICAL FIELD

The present disclosure relates to an ion trap device for trapping ions without exposure of an insulating or dielectric layer and a method for manufacturing the same.

BACKGROUND

The statements in this section merely provide background information related to the present disclosure and do not necessarily constitute prior art.

Quantum key distribution (QKD) systems have design considerations, the most notable of which is the maximum single travel distance of a single photon because of its attenuation while passing through an optical fiber. To increase the maximum single travel distance, signals are amplified using a quantum repeater. Ion trap is a method for implementing a quantum memory for the quantum repeater.

FIGS. 1A to 1C are diagrams illustrating the principle of a three-dimensional trap.

Ion traps are available in a number of shapes depending on the arrangement of the electrodes, including a basic form that can be implemented with a shape of field generated by four electrodes e1, e2, e3 and e4, as shown in FIGS. 1A-1C. When the electrodes e1 and e4 are grounded and a high voltage RF signal is applied to the electrodes e2 and e3 as shown in FIG. 1A, an electric field (E) is formed as shown in FIG. 1B, and the direction of the electric field (E) is continuously changed in response to the radio frequency (RF) of the applied signal. In this case, electrically charged particles are forced, on average, towards the center of the quadrangle (e.g., a square) defined by the electrodes e1, e2, e3 and e4 in FIG. 1B, when the charge amount of the electrically charged particles, the mass of the electrically charged particles, the strength of the electric field and the radio frequency satisfy certain mathematical conditions. The potential generated by such average force is referred to as a ponderomotive potential.

FIG. 1C is a diagram showing the shape of a ponderomotive potential Opp formed by the electrodes e1, e2, e3 and e4. Here, the ponderomotive potential is irrelevant to the sign of a charged particle trapped by the electrodes e1, e2, e3 and e4. The potential continues to centrally attract the charged particle despite its tendency to depart from the z-axis (FIG. 1A), but the potential does not contribute to determining the location where the charged particle may be captured along the z-axis. Therefore, in order to trap the electrically charged particle at the location as in FIG. 1A, voltage is applied to satisfy the condition of V1>V2 for a positive charge and the condition of V1<V2 for a negative charge, instead of grounding the electrodes e1 and e4.

FIG. 2A is a diagram illustrating the principle of a two-dimensional trap, and FIG. 2B is a diagram illustrating the direction of a generated electric field and the ponderomotive potential caused by the generated electric field.

High-precision fabrication of an ion trap device having a three-dimensional structure as shown in FIGS. 1A-1C is difficult to achieve and integration of multiple traps is also difficult to achieve in some situations. Therefore, for the sake of application to quantum information, the design of the ion trap is modified through a micro electro mechanical system (MEMS) process so as to allow fabrication of the ion trap device on a two-dimensional wafer surface. FIG. 2A illustrates a method of performing a conformal mapping of two-dimensional electrodes to a one-dimensional domain. By applying an RF voltage to dark sections of the circumference of a conductive circle and grounding the remainder of the conductive circle as in FIG. 2A, an electric field similar to the one illustrated in FIG. 1B is formed within the circle. As illustrated in FIG. 2A, the tangents of RF electrodes defined above are extended to form sections intersecting with an underline. Then, the RF voltage is applied to the intersecting sections and the remainder is grounded, whereby an electric field similar to the one formed within the circle is established at the location where the center of the circle is positioned. FIG. 2B illustrates the direction of the electric field generated when the electrodes are one-dimensionally arranged and the ponderomotive potential caused by the generated electric field. This is achieved by applying the RF voltage to the two dark bar type electrodes and grounding the center section between the electrodes and opposite sections outside the RF electrodes.

With an electrode structure produced using the principle described above, electrically charged particles may be captured at the triangle mark in FIG. 2B.

MEMS-based planar ion trap chips or surface ion trap chips are manufactured through a process of patterning metal electrodes on a nonconductive substrate. However, the realization of a structurally complicated ion trap is limited because of limited types of the MEMS processes available when using a nonconductive substrate. A solution to this limitation is manufacturing an ion trap chip on a silicon substrate. An ion trap chip formed on a silicon substrate generally includes a conductive film for preventing a loss of the RF voltage, a conductive film constituting RF electrodes and DC (direct current) electrodes, and an insulating layer for preventing a breakdown between the two conductive films. In case of a typical planar ion trap chip, the RF electrodes and the DC electrodes are supported by a patterned insulating layer which is inevitably exposed to at least one ion trapping position. While an ion trapping is under progress, a charge collides with the insulating layer exposed to the ion trapping position, inducing a voltage to the insulating layer which then alters the shape of the electric field and finally causes a micromotion of an ion. The ion micromotion increases a heating rate of the ion, which in turn increases escape probability of the trapped ion. Therefore, in order to achieve a more stable progress of the ion trapping, an ion trap chip needs to be constructed with no insulating layer exposed to the ion trapping position.

DISCLOSURE

Technical Problem

Therefore, the present disclosure in some embodiments seeks to design a structure of an ion trap chip in which an insulating layer included in the ion trap chip is not exposed to an ion trapping position, and to design a process of manufacturing such an ion trap chip, in order to improve the performance of trapping charged particles such as ions.

Another embodiment of the present disclosure provides an ion trap chip structure with no insulating layer exposed to an ion trapping position by passivating a sidewall of the insulating layer with a conductive film.

SUMMARY

In accordance with some embodiments of the present disclosure, an apparatus an ion trap device includes a substrate, at least one central DC electrode, an RF electrode, at least one side electrode, at least one side electrode and an insulating layer. The at least one central DC electrode is disposed over the substrate includes a DC connector pad, and a DC rail connected to the DC connector pad. The RF electrode is disposed over the substrate and includes at least one RF rail located adjacent to the DC rail, and an RF pad connected to the at least one RF rail. The at least one side electrode is disposed over the substrate with the RF electrode disposed between the central DC electrode and the side electrode. The insulating layer is configured to support at least one of the central DC electrode, the RF electrode or the side electrode, on a top surface of the substrate. The insulating layer includes a first insulating layer and a second insulating layer disposed over the first insulating layer, and the second insulating layer includes an overhang that protrudes with respect to the first insulating layer in a width direction of the ion trap device.

In accordance with some embodiments of the present disclosure, the central DC electrode includes a first central DC electrode having a first DC rail and a second central DC electrode having a second DC rail. The first DC rail and the second DC rail may be spaced apart from each other to form a trap region therebetween, and an entire thickness of the substrate may be removed at a region corresponding to the trap region.

In accordance with some embodiments of the present disclosure, the second insulating layer that supports the electrode close to the trap region includes the overhang. The overhang may protrude in a direction heading for the trap region.

In accordance with some embodiments of the present disclosure, the at least one side electrode includes a plurality of side electrodes disposed at predetermined intervals in a longitudinal direction of the RF electrode. A sidewall of at least one of the first insulating layer or the second insulating layer may have a conductive film formed thereon.

In accordance with some embodiments of the present disclosure, a method of manufacturing an ion trap device includes forming a conductive film for a central DC electrode over a substrate, forming a pattern of a first insulating layer on the substrate by using a first mask, forming a pattern of a second insulating layer on the first insulating layer by using a second mask, and forming a conductive film on the pattern of the second insulating layer to form an electrode pattern of at least one of an RF electrode or a side electrode, wherein the second mask is patterned so that the pattern of the second insulating layer has an overhang protruding with respect to the pattern of the first insulating layer in a width direction of the ion trap device.

In accordance with some embodiments of the present disclosure, the method of manufacturing an ion trap device further includes, after the forming of the pattern of the first insulating layer, filling a sacrificial layer in a space between the patterns of the insulating layers, and planarizing a top surface of the substrate by using a lapping process. The method of manufacturing an ion trap device may further include, after the forming of the pattern of the second insulating layer, selectively removing the sacrificial layer. The method of manufacturing an ion trap device may further include, after the forming of the pattern of the second insulating layer, forming a conductive film on at least one of a sidewall of the first insulating layer or a sidewall of the second insulating layer.

Advantageous Effects

As described above, some embodiments in the present disclosure improve capability and reliability in trapping of charged particles, such as ions, by designing the shapes of electrodes for improvement of electrical properties of the electrodes.

Figure 1A:
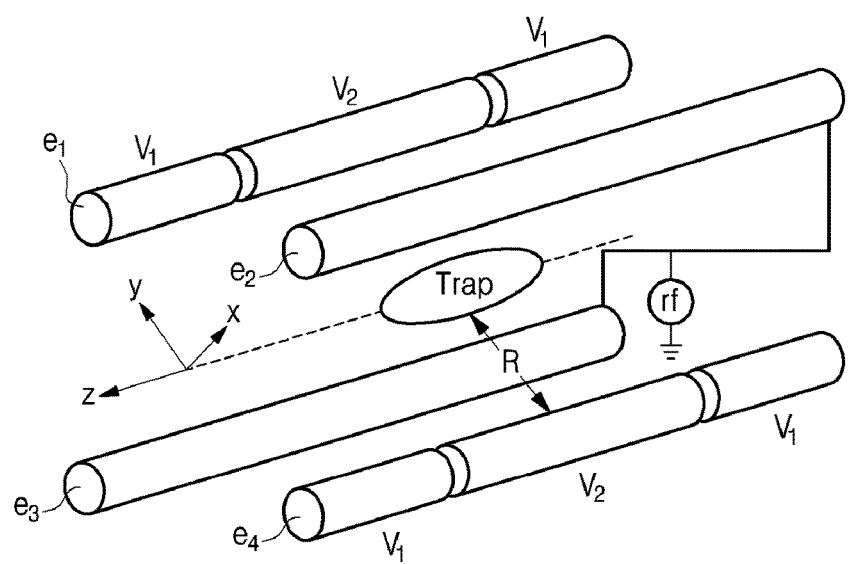
FIGS. 1A-1C are diagrams illustrating the principle of a three-dimensional trap.
Figure 1B:
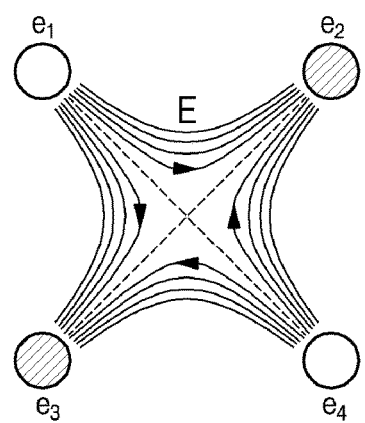
Figure 1C:
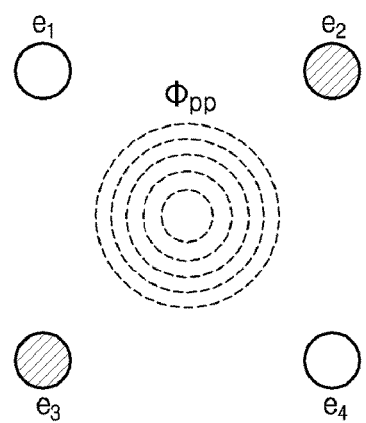
Figure 2A:
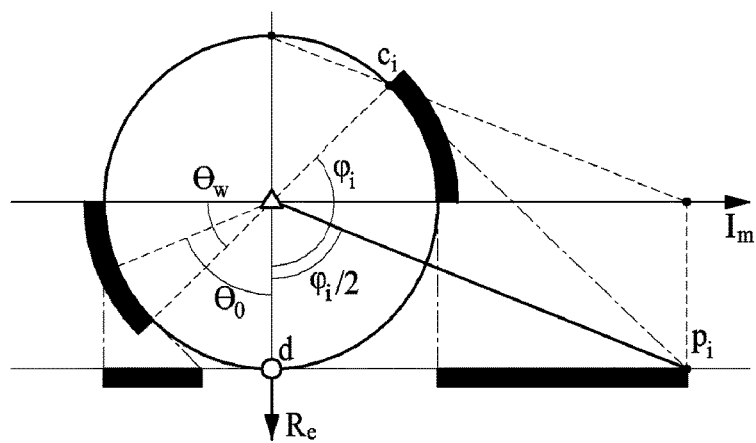
FIG. 2A is a diagram illustrating the principle of a two-dimensional trap.
Figure 2B:
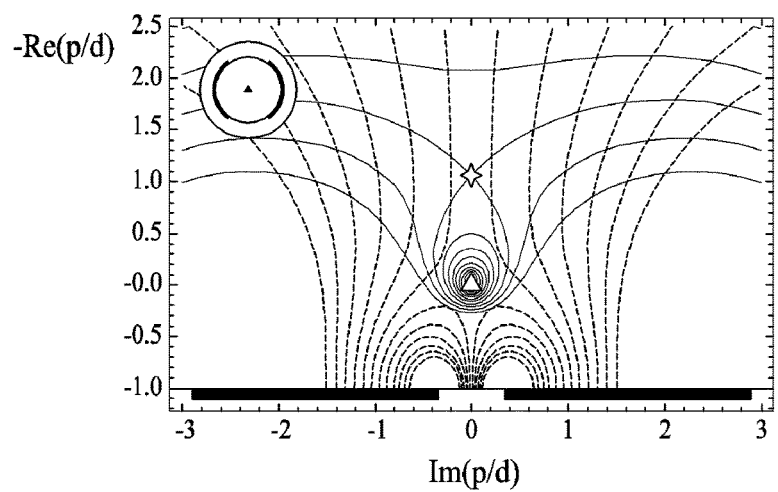
FIG. 2B is a diagram illustrating the direction of a generated electric field and the ponderomotive potential caused by the generated electric field.

| REFERENCE NUMERALS | |
|---|---|
| 10: ion trap device | 101: semiconductor substrate |
| 100: central DC electrode | 110: first central DC electrode |
| 111: first DC connector pad | 112: first DC rail |
| 120: second central DC electrode | 121: second DC connector pad |
| 122: second DC rail | 130: RF electrode |
| 131: first RF rail | 132: second RF rail |
| 133: RF pad | 141, 142: side DC electrode |
| 150: trap region | 300: ground conductive film |
| 301: first ground conductive film | 302: second ground conductive film |
| 303: inter-ground conductive film insulating layer | |
| 304: conductive film bonding pad | |
| 305: area embedded below first insulating layer in area between central DC electrodes | |
| 310: insulating layer | 311, 319: first insulating layer |
| 312: second insulating layer | 313: insulating layer overhang structure |
| 314: first insulating layer sidewall conductive film | |
| 315: second insulating layer sidewall conductive film | |
| 317, 320: TEOS layer | 318: sacrificial layer |
| 330: electrode conductive film | 510: neutral atom injection hole |
| 512: rear etching area for penetrating through semiconductor substrate | |

DETAILED DESCRIPTION

Hereinafter, at least one embodiment of the present disclosure will be described in detail with reference to the accompanying drawings.

Figure 3:
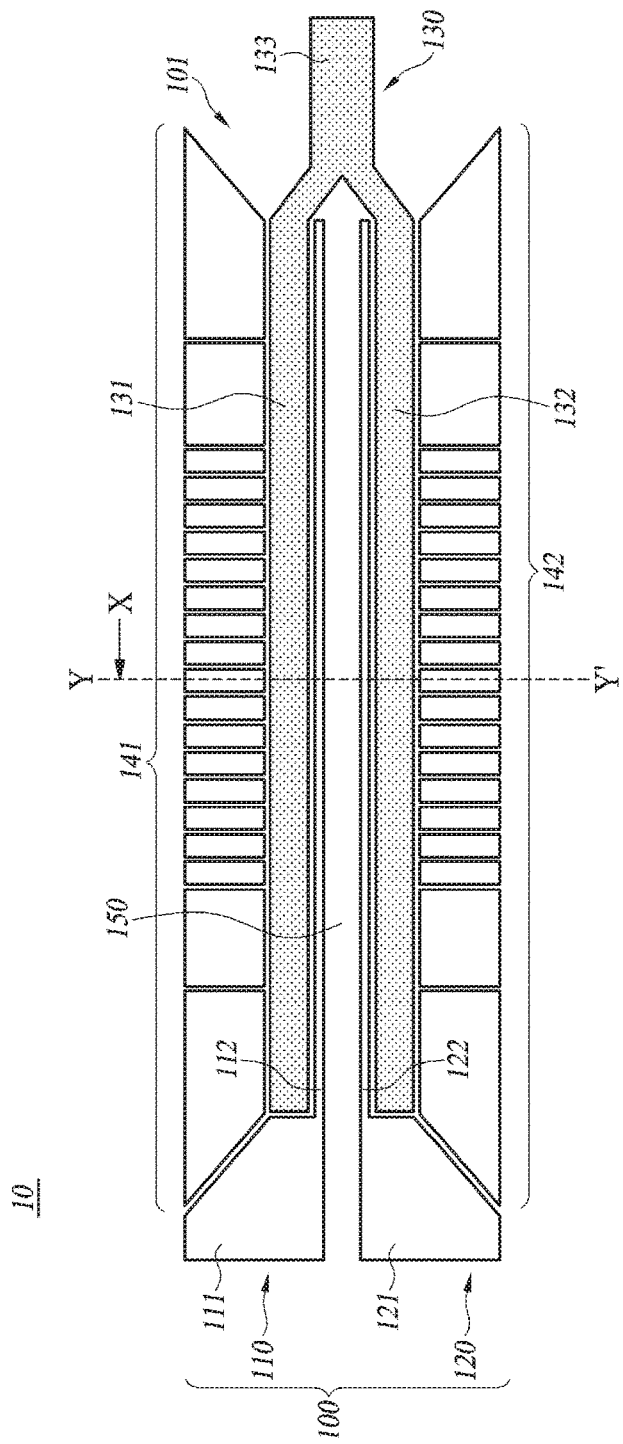
FIG. 3 is a schematic top view showing an ion trap device according to at least one embodiment of the present disclosure.

FIG. 3 is a schematic top view illustrating an ion trap device 10 according to at least one embodiment of the present disclosure.

As illustrated in FIG. 3, the ion trap device 10 includes a semiconductor substrate 101, at least one central DC electrode 100 formed on the semiconductor substrate 101, an RF electrode 130, and at least one side DC electrode 141-142.

In at least one embodiment, the at least one central DC electrode 100 includes a first central DC electrode 110 and a second central DC electrode 120.

The first central DC electrode 110 includes a first DC connector pad 111 formed on the semiconductor substrate 101, and a first DC rail 112 connected to the first DC connector pad 111.

The second central DC electrode 120 includes a second DC connector pad 121 formed on the semiconductor substrate 101, and a second DC rail 122 connected to the second DC connector pad 121.

The first DC rail 112 and the second DC rail 122 have an elongated shape. The first DC rail 112 and the second DC rail 122 are spaced apart from each other by a predetermined gap to define a space serving as a trap region 150. Charged particles which are trapped in the trap region 150 include ions in some embodiments, but the present disclosure is not limited thereto and ion traps in accordance with some embodiments are configured to trap any charged particles.

In some embodiments, the central DC electrodes 110 and 120 are formed on a conductive film different from that on which the RF electrode 130 and the side DC electrodes 141 and 142 are formed, but not limited thereto. In some embodiments, the central DC electrodes 110 and 120, the RF electrode 130, and the side DC electrodes 141 and 142 are formed on the same conductive film.

The RF electrode 130 includes at least one RF rail and an RF pad 133 which are formed on the semiconductor substrate 101. For example, the at least one RF rail includes a first RF rail 131 and a second RF rail 132, which are connected to the RF pad 133.

The first RF rail 131 and the second RF rail 132 each have an elongated shape and have a larger width than that of the first DC rail 112 and the second DC rail 122.

The at least one side DC electrode 141, 142 includes a plurality of first side electrodes 141 on the opposite side of the trap region 150 with respect to the first RF rail 131, and a plurality of second side electrodes 142 on the opposite side of the trap region 150 with respect to the second RF rail 132. That is, the first RF rail 131 is arranged between the trap region 150 and the plurality of first side electrodes 141, and the second RF rail 132 is arranged between the trap region 150 and the plurality of second side electrodes 142.

The plurality of side DC electrodes 141 and 142 are arranged at predetermined intervals in a longitudinal direction of the RF electrode 130. For example, the plurality of first side electrodes 141 are arranged at predetermined intervals in a longitudinal direction of the first DC rail 112, and the plurality of second side electrodes 142 are arranged at predetermined intervals in a longitudinal direction of the second DC rail 122.

Figure 4:
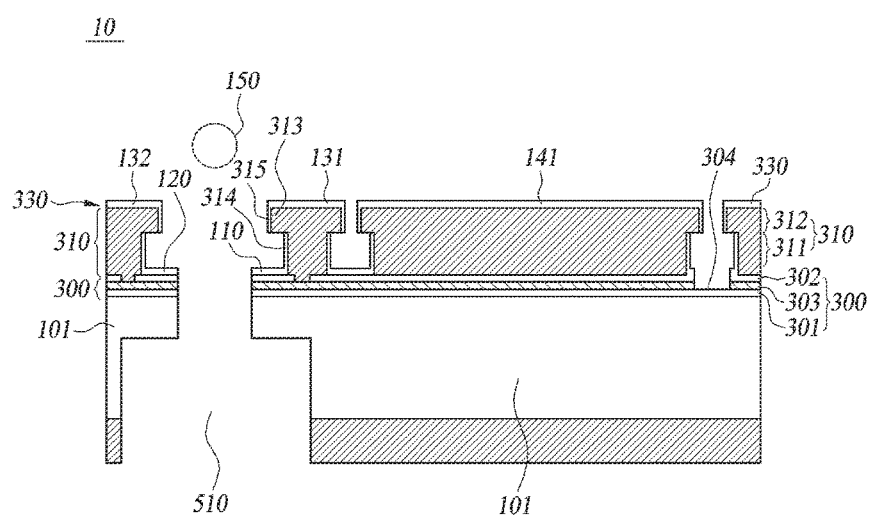
FIG. 4 is a cross-sectional view of an ion trap device partially cut along line Y-Y' in FIG. 3 as viewed in a direction X.

FIG. 4 is a cross-sectional view of an ion trap device partially cut along line Y-Y' in FIG. 3 as viewed in a direction X.

As shown in FIG. 4, ion trap device 10 according to at least one embodiment of the present disclosure includes silicon semiconductor substrate 101, a ground conductive film 300 for preventing a lost RF voltage, and an electrode conductive film 330 that constitutes central DC electrodes 110, 120, RF electrode 130, and side DC electrodes 141, 142. The ion trap device 10 further includes an insulating layer 310 for preventing a breakdown between the ground conductive film 300 and the electrode conductive film 330.

The ground conductive film 300 includes a first ground conductive film 301, a second ground conductive film 302, and an insulating layer 303 between the ground conductive films. The insulating layer 303 between the ground conductive films electrically isolates the central DC electrode 110, 120 from the other areas on the second ground conductive film 302.

Other than the central DC electrodes 110, 120, the second ground conductive film 302 and the first ground conductive film 301 are connected to the GND, so as to prevent a loss of the RF voltage through the silicon substrate 101. A first ground conductive film bonding pad 304 is formed to connect the first ground conductive film 301 to the GND, and although it is now shown in FIG. 4, bonding pads are also provided for connecting the central DC electrodes 110 and 120 and the second ground conductive film 302 to the GND.

As shown in FIG. 4, the insulating layer 310 electrically isolates the ground conductive film 300 from the electrode conductive film 330.

The insulating layer 310 includes a first insulating layer 311 and a second insulating layer 312, and processes of forming and patterning are performed on the first insulating layer 311 and the second insulating layer 312 separately.

A pattern for foming the first insulating layer 311 is designed to be wider than that of the second insulating layer 312 by a predetermined width, so as to form an insulating layer overhang structure 313 that has the second insulating layer 312 protrude over the first insulating layer 311. Further, first and second conductive films 314 and 315 are formed on sidewalls of the first insulating layer 311 and the second insulating layer 312 to prevent the insulating layers from being exposed. The first insulating layer-sidewall conductive film 314 is electrically connected to the second ground conductive film 302, and the second insulating layer-sidewall conductive film 315 is electrically connected to the electrode conductive film 330.

A protruding length of the insulating layer overhang structure 313 equals to a distance between the second insulating layer sidewall conductive film 315 to which the RF voltage is applied and the first insulating layer sidewall conductive film 314 to which the RF ground is connected, and the protruding length is determined to prevent a breakdown due to a high voltage. The overhang structure 313 of the second insulating layer 312 allows the first insulating layer 311 to reduce its sidewall area being exposed to ions trapped in the trap region, and to minimize the possibility that a sidewall of the first insulating layer 311 and a sidewall of the second insulating layer 312 be charged by the first insulating layer-sidewall conductive film 314 and the second insulating layer-sidewall conductive film 315.

As shown in FIG. 4, the RF electrode 130 and the side DC electrodes 141 and 142 are formed through a patterning process of the electrode conductive film 330. Although not shown in FIG. 4, the ion trap device 10 is also provided with a bonding pad for applying an RF voltage to the RF electrode 130 and a bonding pad for applying a DC voltage to the plurality of side DC electrodes 141 and 142.

In the ion trap device 10 shown in FIGS. 3 and 4, ions can be trapped by connecting a DC power to the first central DC electrode 110 and the second central DC electrode 120, and a high-voltage RF power to the RF electrode 130, and connecting the GND to the ground conductive film 300, then applying a predetermined voltage to the plurality of first side electrodes 141 and the plurality of second side electrodes 142 at around the target position of ion trapping.

The semiconductor substrate 101 below the trap region 150 is penetrated in the vertical direction to form a neutral atom injection hole 510, so that neutral atoms can be easily injected before an ionization process.

Figure 5:
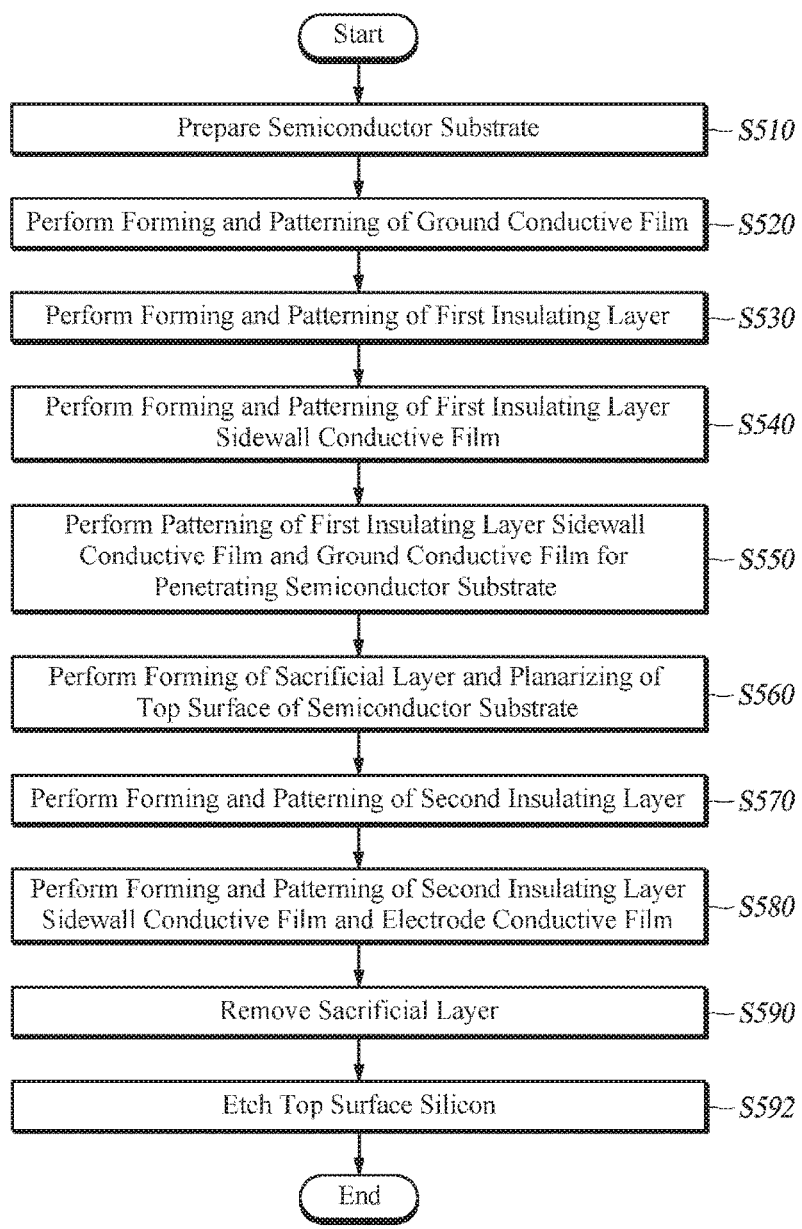
FIG. 5 is a flowchart of manufacturing an ion trap device according to at least one embodiment of the present disclosure.

FIG. 5 is a flowchart of manufacturing the ion trap device according to at least one embodiment of the present disclosure.

As shown in FIG. 5, the method of manufacturing an ion trap chip according to at least one embodiment of the present disclosure includes the steps of preparing a semiconductor substrate (S510), forming and patterning a ground conductive film (S520), forming and patterning a first insulating layer (S530), forming and patterning a first insulating layer-sidewall conductive film (S540), patterning the first insulating layer-sidewall conductive film 314 and the ground conductive film 300 for penetrating the semiconductor substrate (S550), forming a sacrificial layer and planarizing the top surface of the semiconductor substrate (S560), forming and patterning a second insulating layer (S570), forming a second insulating layer sidewall conductive film and an electrode conductive film (S580), removing the sacrificial layer (S590), and etching top surface silicon (S592).

Figure 6:
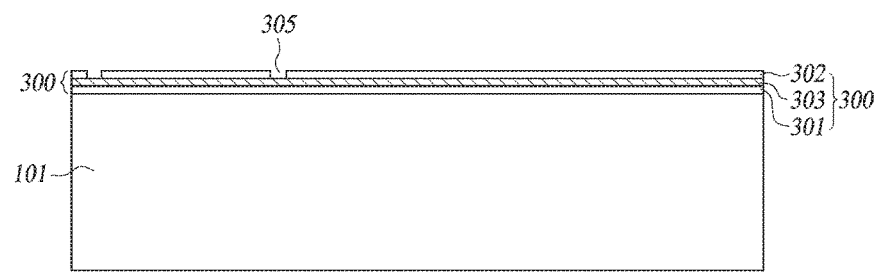
FIG. 6 is a cross-sectional view of an ion trap chip after forming and patterning a ground conductive film 300.
Figure 7:
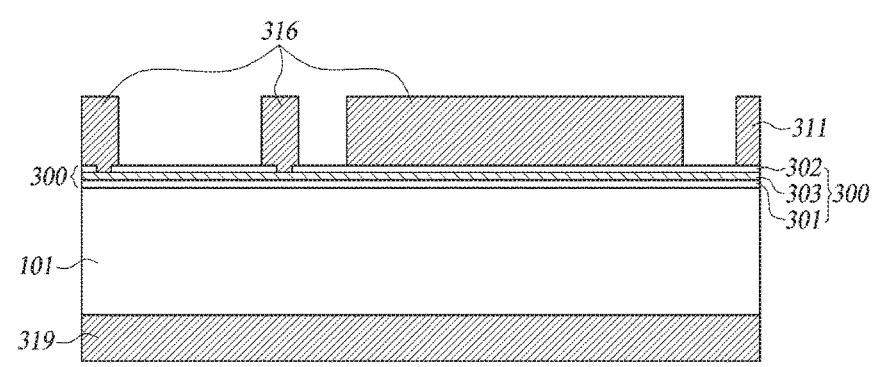
FIG. 7 is a cross-sectional view of the ion trap chip after forming and patterning a first insulating layer 311.
Figure 8:
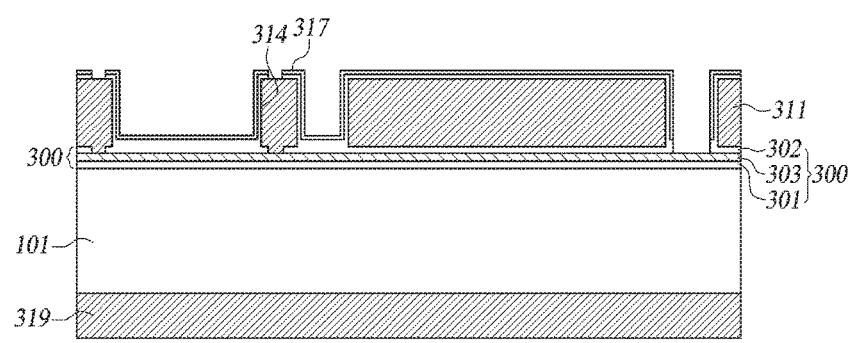
FIG. 8 is a cross-sectional view of the ion trap chip after forming and patterning a first insulating layer sidewall conductive film 314.
Figure 9:
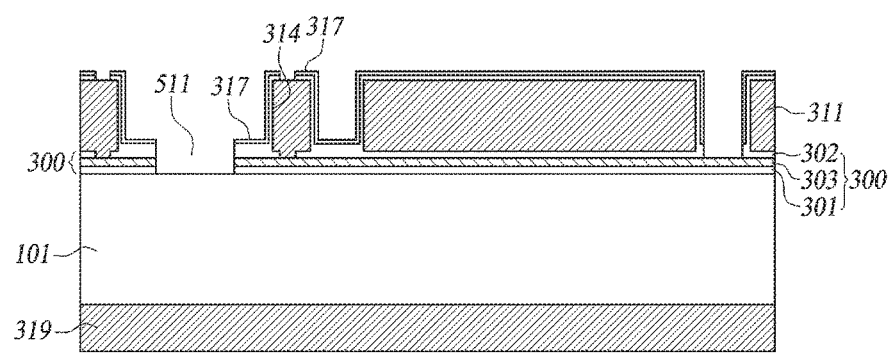
FIG. 9 is a cross-sectional view of the ion trap chip after patterning the ground conductive film 300 for penetrating through a semiconductor substrate 101.
Figure 10:
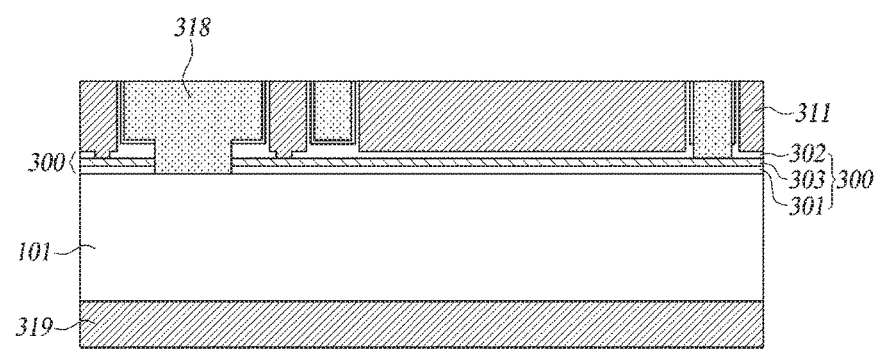
FIG. 10 is a cross-sectional view of the ion trap chip after forming a sacrificial layer 318 and planarizing a top surface of the semiconductor substrate.
Figure 11:
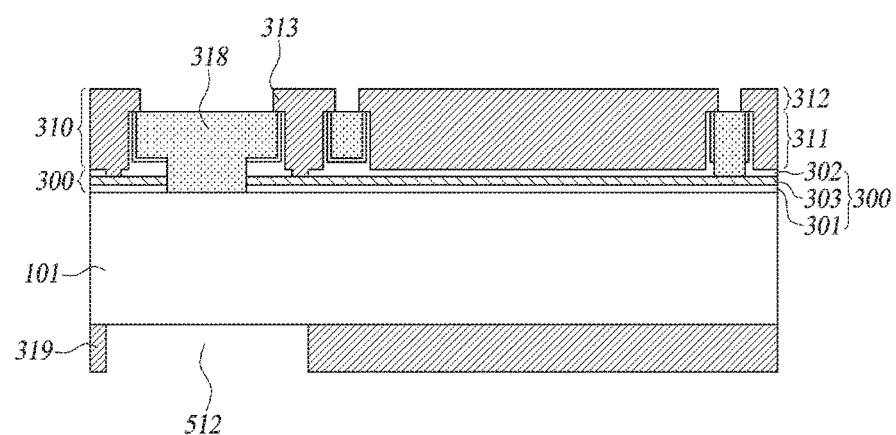
FIG. 11 is a cross-sectional view of the ion trap chip after forming and patterning a second insulating layer 312.
Figure 12:
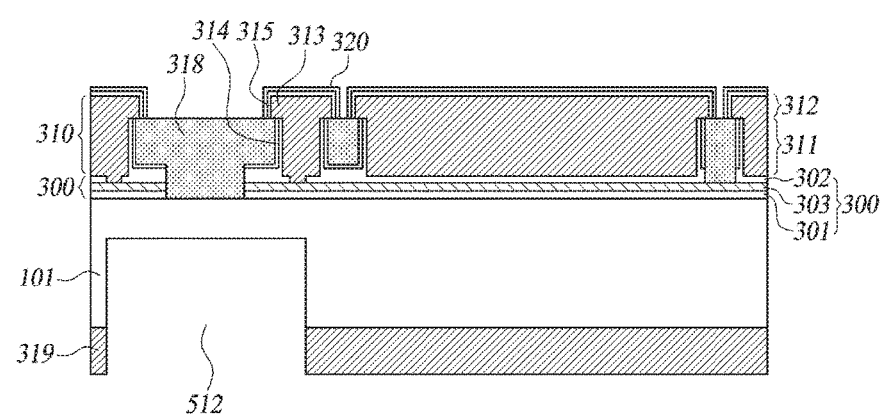
FIG. 12 is a cross-sectional view of the ion trap chip after forming and patterning a second insulating layer sidewall conductive film 315 and an electrode conductive film 330.
Figure 13:
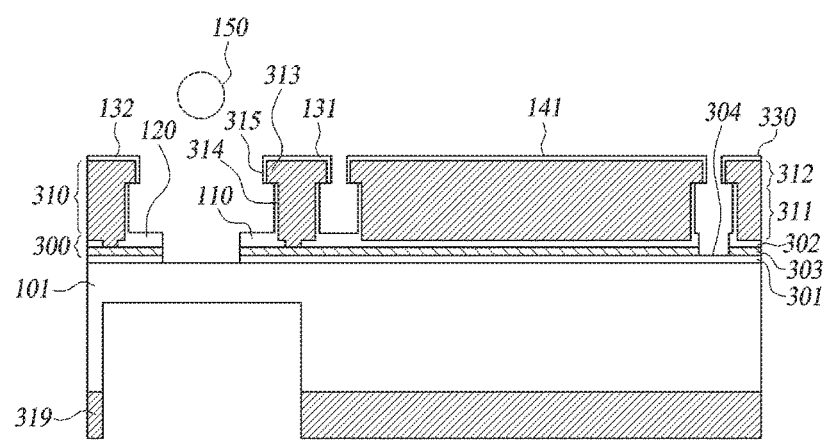
FIG. 13 is a cross-sectional view of the ion trap chip after removing the sacrificial layer 318.
Figure 14:
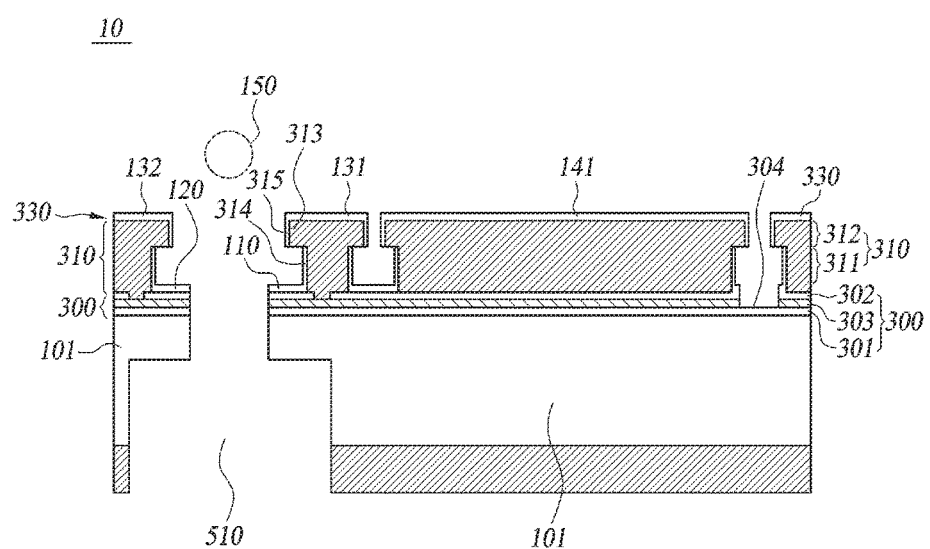
FIG. 14 is a cross-sectional of the ion trap chip 10 after etching the top surface silicon.

FIG. 6 illustrates a cross-sectional of the ion trap chip after forming and patterning the ground conductive film 300 (S520) after preparing the semiconductor substrate (S510). FIG. 7 illustrates a cross-sectional view of the ion trap chip after forming and patterning the first insulating layer 311 (S530). FIG. 8 illustrates a cross-sectional of the ion trap chip after forming and patterning the first insulating layer sidewall conductive film 314 (S540). FIG. 9 illustrates a cross-sectional of the ion trap chip after patterning the first insulating layer sidewall conductive film 314 and the ground conductive film 300 for penetrating through the semiconductor substrate 101 (S550). FIG. 10 illustrates a cross-sectional of the ion trap chip after forming the sacrificial layer 318 and planarizing the top surface of the semiconductor substrate (S560). FIG. 11 illustrates a cross-sectional of the ion trap chip after forming and patterning the second insulating layer 312 (S570). FIG. 12 illustrates a cross-sectional of the ion trap chip after forming and patterning the second insulating layer sidewall conductive film 315 and the electrode conductive film 330 (S580). FIG. 13 illustrates a cross-sectional of the ion trap chip after removing the sacrificial layer 318 (S590). FIG. 14 illustrates a cross-sectional of the ion trap chip 10 after etching the top surface silicon (S592).

As shown in FIG. 6, in the step of forming and pattering the ground conductive film 300 (S520), the ground conductive film 300 is made with the first ground conductive film 301, the second ground conductive film 302, and the insulating layer 303 between the ground conductive films. A metal material for use in a ultra high vacuum environment, such as aluminum and gold, can be used as material for the conductive films; however, the present disclosure is not limited to this. The conductive films can be deposited by using sputtering, evaporation, or the like. The material for the insulating layer 303 may be tetraethyl orthosilicate (TEOS) which is deposited by using the plasma enhanced chemical vapor deposition (PECVD); however, the present disclosure is not limited to this. In the step of patterning the second ground conductive film 302, patterning is performed on an area 305 embedded below the first insulating layer 311 among the boundary between the two side DC electrodes 141 and 142 to remove the corresponding portion of the second ground conductive film 302. While the present disclosure is not so limited, dry plasma etching may be used as a method of removing the area 305 embedded below the first insulating layer 311 among the boundary between the side DC electrodes 141 and 142.

As shown in FIG. 7, in the step of depositing and patterning the first insulating layer 311 (S530), first insulating layers 311 and 319 are respectively formed on top and bottom surfaces of the semiconductor substrate 101, and the first insulating layer 311 is patterned to remove portions other than areas 316 supporting the RF electrode 130 and the plurality of side DC electrodes 141 and 142. The material for the first insulating layer 311 may be tetraethyl orthosilicate (TEOS) or silicon dioxide ($SiO_2$) which is deposited by using the PECVD but, the present disclosure is not limited to this.

In the step of forming and pattering the first insulating layer sidewall conductive film 314 (S540) as shown in FIG. 8, the first insulating layer sidewall conductive film 314 is formed on the top surface of the prepared semiconductor substrate 101. Then, the boundary between the central DC electrodes 110 and 120 is patterned to remove the second ground conductive film 302 and the first insulating layer sidewall conductive film 314 at corresponding areas. The first insulating layer sidewall conductive film 314 may be formed of, but not limited to, a metal material for use in a ultra high vacuum environment, such as aluminum and gold, deposited by using the sputtering or the evaporation.

A TEOS layer 317 is deposited by using the PECVD and a photosensitizer is coated before removing the corresponding areas of the second ground conductive film 302 and the first insulating layer sidewall conductive film 314. An available photosensitizer is leftover after the photolithography patterning process performed on the second ground conductive film 302 and the first insulating layer sidewall conductive film 314 at the corresponding areas to remove, and the remaining photosensitizer is used as a mask to etch the TEOS layer 317 by using a plasma dry etching process. The photosensitizer is removed after etching the TEOS layer 317, and the TEOS layer 317 is used as a mask to remove the second ground conductive film 302 and the first insulating layer sidewall conductive film 314 at the corresponding areas.

The first insulating layer sidewall conductive film 314 is formed in order to prevent the first insulating layer 311 from capturing the ion, thus improving the capability and reliability in trapping of the ions.

As shown in FIG. 9, in the step of patterning the first insulating layer sidewall conductive film 314 and the ground conductive film 300 for penetrating the semiconductor substrate 101 (S550), an area 511 for etching to penetrate the semiconductor substrate 101 is patterned to remove the first insulating layer sidewall conductive film 314 and the ground conductive film 300 at the corresponding area. While the present disclosure is not so limited, dry plasma etching may be used as a method of removing the TEOS mask layer 317, the first insulating layer sidewall conductive film 314, and the ground conductive film 300.

As shown in FIG. 10, in the step of forming the sacrificial layer 318 and planarizing the top surface of the semiconductor substrate 101 (S560), a sacrificial layer is formed for supporting the insulating layer overhang structure 313 shown in FIG. 11, which is described later, and the top surface of the semiconductor substrate 101 is planarized by using a chemical mechanical polishing (CMP) process to fill the sacrificial layer between the patterns of the first insulating layer 311. A metal such as copper, tungsten, or nickel can be used as the material for the sacrificial layer 318; however, the present disclosure is not limited to this. A material of choice would not damage other materials constituting the ion trap device 10 in the step of removing the sacrificial layer 318 through the wet etching process. Further, a plating process may be used for forming the sacrificial layer; however, the present disclosure is not limited to this.

As shown in FIG. 11, in the step of depositing and patterning the second insulating layer 312 (S570), the second insulating layer 312 is formed on the top surface of the semiconductor substrate 101, and an area for forming the insulating layer overhang structure 313 is patterned to remove the second insulating layer 312 at the corresponding area. The material for the second insulating layer 312 may include tetraethyl orthosilicate (TEOS) or silicon dioxide (SiO$_2$) deposited by using the PECVD; however, the present disclosure is not limited to this. Further, an area 512 for performing a bottom surface etching for penetrating the semiconductor substrate 101 is patterned to remove the bottom surface insulating layer 319 at the corresponding area. While the present disclosure is not so limited, dry plasma etching may be used as a method of removing the bottom surface insulating layer 319.

In the process of patterning the second insulating layer 312, a pattern width for the formation of each of the electrodes 130, 141, and 142 over the second insulating layer 312 is patterned to be wider than a pattern width for the formation of the first insulating layer 311 below by a predetermined width, that is, the difference of the pattern widths between the second insulating layer 312 and the pattern width of the first insulating layer 311 of the corresponding area below, resulting in an overhang length of the second insulating layer 312. The second insulating layer 312 can be stably patterned by being supported by the sacrificial layer 318, which provides the insulating layer overhang structure 313 of a precise length. This insulating layer overhang structure 313 allows the sidewall of the insulating layer to have a reduced area exposed to the captured ions.

The pattern width means a length (i.e., a width) in a direction perpendicular to the longitudinal direction of the first RF rail 131 and the second RF rail 132. For example, the pattern width of the second insulating layer 312 on the mask for forming the pattern of the second insulating layer 312 is set to be longer than the pattern width of the first insulating layer 311 on the mask for forming the pattern of the first insulating layer 311.

In some embodiments, out of the electrodes 131, 132, 141 and 142, only the first RF rail 131 and the second RF rail 132 close to the trap region 150 each have the overhang in the width direction. Moreover, the overhang structure 313 may be formed only in a direction heading for the trap region 150.

As shown in FIG. 12, in the step of forming and patterning the second insulating layer sidewall conductive film 315 and the electrode conductive film 330 (S580), the electrode conductive film 330 is formed over the top surface of the semiconductor substrate 101, and the boundary between the RF electrode 130 and the side DC electrodes 141 and 142 is patterned to remove the electrode conductive film 330 at the corresponding area. The material for the electrode conductive film 330 may be one of metal materials for use in a high vacuum environment, such as aluminum and gold deposited by using the sputtering or the evaporation; however, the material or the method of forming the electrode conductive film 330 is not limited to this. In the process of depositing the electrode conductive film 330, the metal material is also deposited on the sidewall of the second insulating layer 312, to form the second insulating layer sidewall conductive film 315. Further, when removing the electrode conductive film 330 at the corresponding area, the TEOS mask layer 320 can be formed and patterned as an alternative to the photosensitizer for use as a mask for removing the electrode conductive film 330 at the corresponding area, similar to the step of forming and patterning the first insulating layer sidewall conductive film 314 (S540).

Further, the time for penetrating the semiconductor substrate can be shortened by etching the bottom surface etching area 512 by using a deep reactive ion etching (DRIE).

As shown in FIG. 13, in the step of removing the sacrificial layer 318 (S590), the sacrificial layer 318 is selectively removed by using a liquid chemical such as strong acid or strong alkali not to damage the other materials constituting the ion trap device 10. Alternatively, it can be removed by wet etching the TEOS mask layer that has been used in the process of patterning the first insulating layer sidewall conductive film 314 shown in FIG. 8 or in the process of patterning the electrode conductive film 330 shown in FIG. 12.

As shown in FIG. 14, in the step of etching the top surface silicon (Step S592) after completing all the wet etching process, the trap region 150 is etched on the top surface of the semiconductor substrate 101 to remove the area of the semiconductor substrate 101 corresponding to the trap region 150. The neutral atom injection hole 510 is formed by performing the DRIE on the top surface of the semiconductor substrate 101.

As described above, some embodiments in the present disclosure are highly useful because capability and reliability in trapping of charged particles, such as ions, are improved by designing the shapes of electrodes for improvement of electrical properties of the electrodes.

Although exemplary embodiments of the present disclosure have been described for illustrative purposes, those skilled in the art will appreciate that various modifications, additions and substitutions are possible, without departing from the idea and scope of the claimed invention. Specific terms used in this disclosure and drawings are used for illustrative purposes and not to be considered as limitations of the present disclosure. Specific terms used in this disclosure and drawings are used for illustrative purposes and not to be considered as limitations of the present disclosure. Therefore, exemplary embodiments of the present disclosure have been described for the sake of brevity and clarity. Accordingly, one of ordinary skill would understand the scope of the claimed invention is not to be limited by the explicitly described above embodiments but by the claims and equivalents thereof.

The invention claimed is:

1. An ion trap device, comprising:
   a substrate;
   at least one central DC electrode disposed over the substrate and comprising:
      a DC connector pad, and
      a DC rail connected to the DC connector pad;
   an RF electrode disposed over the substrate and comprising:
      at least one RF rail located adjacent to the DC rail, and
      an RF pad connected to the at least one RF rail;
   at least one side electrode disposed over the substrate with the RF electrode disposed between the central DC electrode and the side electrode; and
   a plurality of insulating layers configured to support at least one of the central DC electrode, the RF electrode or the side electrode, on a top surface of the substrate,
   wherein
   the plurality of insulating layers includes a first insulating layer and a second insulating layer disposed over the first insulating layer,
   the second insulating layer includes an insulating overhang that protrudes with respect to the first insulating layer in a width direction of the ion trap device, and
   the insulating overhang comprises at least one bottom side, substantially parallel to the substrate, and a lateral sidewall, substantially perpendicular to the substrate,
   wherein the lateral sidewall of the insulating overhang has a conductive film formed thereon, and
   wherein the bottom side has no conductive film formed thereon.

2. The ion trap device of claim 1, wherein
   the central DC electrode comprises a first central DC electrode having a first DC rail and a second central DC electrode having a second DC rail,
   the first DC rail and the second DC rail are spaced apart from each other to form a trap region therebetween, and
   an entire thickness of the substrate is removed at a region corresponding to the trap region.

3. The ion trap device of claim 2, wherein the second insulating layer that supports the electrode close to the trap region includes the insulating overhang.

4. The ion trap device of claim 2, wherein the insulating overhang protrudes in a direction heading for the trap region.

5. The ion trap device of claim 1, wherein the at least one side electrode includes a plurality of side electrodes disposed at predetermined intervals in a longitudinal direction of the RF electrode.

6. The ion trap device of claim 1, wherein
   the conductive file is electrically connected to an electrode conductive film.

* * * * *